United States Patent [19]
Ramachandran

[11] Patent Number: 6,002,857
[45] Date of Patent: Dec. 14, 1999

[54] SYMBOLIC CONSTRAINT-BASED SYSTEM FOR PREROUTE RECONSTRUCTION FOLLOWING FLOORPLAN INCREMENTING

[75] Inventor: Venkateswaran ("Venky") Ramachandran, Mountain View, Calif.

[73] Assignee: Avant! Corporation, Fremont, Calif.

[21] Appl. No.: 08/748,764

[22] Filed: Nov. 14, 1996

[51] Int. Cl.⁶ ..................... G06F 15/46
[52] U.S. Cl. ............. 395/500.15; 395/500.14
[58] Field of Search ..................... 364/491

[56] References Cited

U.S. PATENT DOCUMENTS

| | | | |
|---|---|---|---|
| 4,815,003 | 3/1989 | Putatunda et al. | 364/491 |
| 5,485,396 | 1/1996 | Brasen et al. | 364/491 |
| 5,666,288 | 9/1997 | Jones et al. | 364/490 |
| 5,856,927 | 1/1999 | Greidinger | 364/491 |

*Primary Examiner*—Kevin J. Teska
*Assistant Examiner*—Thuan Do
*Attorney, Agent, or Firm*—Thomas E. Schatzel; Law Offices of Thomas E. Schatzel, A Prof. Corp.

[57] ABSTRACT

The present invention includes a method for automatically reconstructing most of the power, ground and clock prerouting without significant user involvement. This enables several floorplans to be tried concurrently in a batch mode. The method automatically migrates many floorplans in increments to find the best result for each starting floorplan. The user is then free to select a floorplan that looks best from the candidates generated with all the special net routing patterns already considered and updated for each.

11 Claims, 2 Drawing Sheets

SYMBOLIC CONSTRAINT-BASED SYSTEM FOR PREROUTE RECONSTRUCTION FOLLOWING FLOORPLAN INCREMENTING

BACKGROUND OF THE INVENTION

1. Field of the Invention

The present invention relates generally to automatic integrated-circuit placement and routing tools, and more particularly to symbolic constraint-based systems for preroute reconstruction following floorplan incrementing.

2. Description of the Prior Art

After the logic circuitry for a very large scale integrated (VLSI) circuit has been designed, placement "algorithms", really computer-implemented processes, are used to "place" each circuit macrocell of the VLSI circuit logic in the floorplan of an integrated circuit (IC) chip. Computer-implemented processes, called "routers", are used to interconnect the macrocells into wire networks, e.g., "nets". Local bundles of these connection networks have a measurable width and take up space on the integrated circuit. Too many connections may be attempted through a bundle that passes between macrocells, and this can stymie the automatic design by becoming congested.

Preferably, the locations selected for each macrocell and the wire routing choices have been optimal. An acceptable placement of component blocks occurs when the unused space between component blocks is at a minimum, and when the overall area used for the whole design is minimized.

Beyond the wire connection of functional networks that provide the various signal paths within an IC, it is also necessary to route special wire networks, e.g., ground, power and clocks. See, Andrew S. Moulton, "Laying the Power and Ground Wires on a VLSI Chip", 20th Design Automation Conference, IEEE, 1983, pp. 754–755; and, David W. Russell, "Hierarchical Routing of Single Layer Metal Trees in Compiled VLSI", ICCAD, IEEE, 1985, pp. 270–272. The special connections of power and ground are needed by just about all the active cells in a device, and their connection can sometimes compete with the required signal net connections.

Daniel R. Brasen describes, in U.S. Pat. No. 5,485,396, issued Jan. 16, 1996, a floorplan of component blocks of logical circuits, including the symbolic routing of major connection networks, which is produced as part of the process for laying out an integrated circuit on a chip. The floorplan is done before optimized placement and routing of the logical circuits within the individual component blocks of the VLSI circuit. The logical circuits are apportioned into component blocks. Then, an initial layout of the component blocks of the VLSI circuit is made. The major connection networks are routed between the component blocks so that the major connection networks are connected to connection areas within the component blocks. The initial layout of the component blocks is adjusted, as necessary, to take into account the addition of the major connection networks. Then, routing guidance information is generated as part of the floorplan. The routing guidance information indicates locations and sizes of each of the major connection networks.

Daniel R. Brasen also describes, in U.S. Pat. No. 5,349,542, issued Sep. 20, 1994, the calculating of segments within a power network of an integrated circuit using information generated during design and placement. The performance of logic blocks within the integrated circuit is simulated to obtain an estimated maximum current requirement for each logic block. After estimating the maximum current requirement for each logic block, the maximum current flow through each power net segment is obtained by summing the current requirements for each logic block which draws current through the power net segment. Based on this maximum current flow through each power segment, the width for each power net segment is calculated. A check may be made to assure that a predetermined electromigration limit is not exceeded. When the projected current flow through a power net segment exceeds the predetermined electromigration limit, the width of the power net segment is increased.

Steven L. Crain, et al., describes in U.S. Pat. No. 5,311,443, issued May 10, 1994, a rule-based floorplanner for a macrocell array comprising a plurality of predetermined macrocells. The floorplanner uses a net list, a macrocell list, and a list of design constraints and characteristics of the base array itself to derive an initial Burain score. A trial floorplan is attempted and checked against a list of theoretical rules and a list of empirical rules to determine a measured Burain score which accurately indicates the difficulty which can be expected when completing the design.

For the physical design of very large scale integration (VLSI) chips, Klein, et al., describes a method for implementing a high density master image of logic, e.g., in U.S. Pat. No. 4,890,238, issued Dec. 26, 1989. In a hierarchical top-down design methodology, the chip circuitry is logically divided into partitions that are manageable by the present automatic design systems and programs. Global wiring connection lines are included in the initial design of the different individual partitions and treated there in the same way as circuits in that area. The various partitions are designed in parallel. A floorplan is established that provides the different partitions shaped in such a way that they fit together without leaving any space between the different individual partitions.

Conventional design approaches begin with a fixed core area and place the various blocks (macrocells) within the floorplan. The rest of the core area is then used for the placement of standard cells. If the floorplan is not just right, local congestion of routing resources can lead to incomplete connections. Getting stuck this way necessitates re-running the placement and routing processes. Several such iterations may be required with intermediate fudging by the user before 100% routing completion is obtained. using core areas larger than actually required can solve the completion problem, but wastes considerable floorplan area.

Multiple place and route passes waste time. Each pass must necessarily redo all the special routing too, e.g., power, ground, and clock prerouting for each floorplan change. Since such prerouting usually needs considerable user intervention, especially when the design has several macrocell blocks, the turnaround time can be considerably extended for each additional pass. Ignoring the special prerouting before doing the floorplan is not possible, since the placement and routing are so greatly impacted.

SUMMARY OF THE INVENTION

It is therefore an object of the present invention to provide a design size optimizer and prewirer process for the automatic macrocell placement and routing of metal layers in a standard macrocell array chip design.

It is a further object of the present invention to provide an electronic design automation tool that significantly reduces the design sizes of chips.

Briefly, a method embodiment of the present invention for reconstructing prewires in the automatic placement and design of an integrated circuit chip comprises calling a design size optimization and prewirer process with a list of blocks comprising information related to an original bounding box, a final bounding box and an indication of macrocell versus standard cell. Then inputting a list of prewire information from a design database. And outputting a set of new locations and new lengths for the prewire information back to the design database. The process ends by returning to a placement process.

An advantage of the present invention is that an electronic design automation tool is provided for efficient prerouting of power and ground connections.

Another advantage of the present invention is that an electronic design automation tool is provided that reduces localized routing congestion in a single pass implementation that economizes run-times.

These and other objects and advantages of the present invention will no doubt become obvious to those of ordinary skill in the art after having read the following detailed description of the preferred embodiments which are illustrated in the various drawing figures.

IN THE DRAWINGS

DETAILED DESCRIPTION OF THE PREFERRED EMBODIMENT

Figure 1:
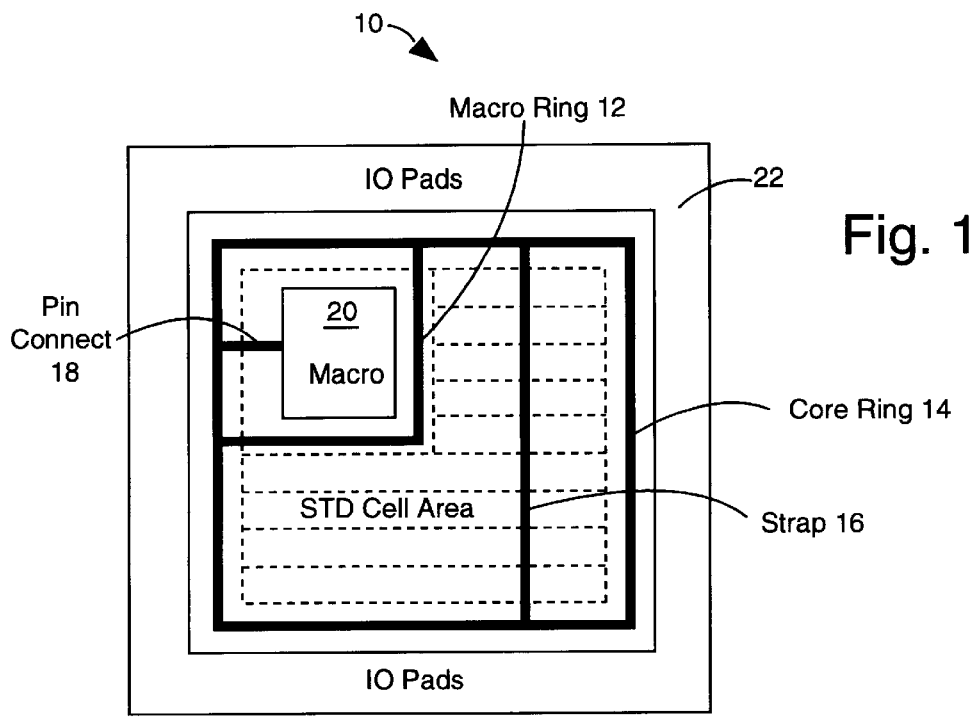
FIG. 1 is a floorplan of a chip to be designed by a computer aided design tool of the present invention.

FIG. 1 illustrates a chip floorplan 10 to be automatically constructed with a design size optimizer and prewirer that reconstructs power-ground-clock preroutes for a placement and routing process. A floorplan can be split into several blocks of macrocells, with a remainder that includes standard cell rows that are split horizontally into a list of non-overlapping rectangles that themselves become blocks, e.g., to avoid polygons. A macro ring 12, a core ring 14, a strap 16 and a pin connect 18 structure respectively encircle a macrocell 20, encircle the whole core area of the floorplan 10, pass by vertically or horizontally, or stub connect to the macrocell 20. An area 22 that forms a perimeter around the standard cell core area is reserved for input-output pads. Rings are typically closed loops around the core area (core ring 14), or closed loops around macrocell blocks (macrocell rings 12), and serve as the main conduits of power to both the chip and its macrocells, e.g., the power can be tapped off wherever necessary. Straps are typically used to connect two ring segments together, often at equal spaced intervals, e.g., to form a power mesh. Pin connects are used to wire the input-output pads (I/O-pads) to core rings, or to wire the macrocell power-ground-clock pins to a neighboring ring or strap.

Figure 2:
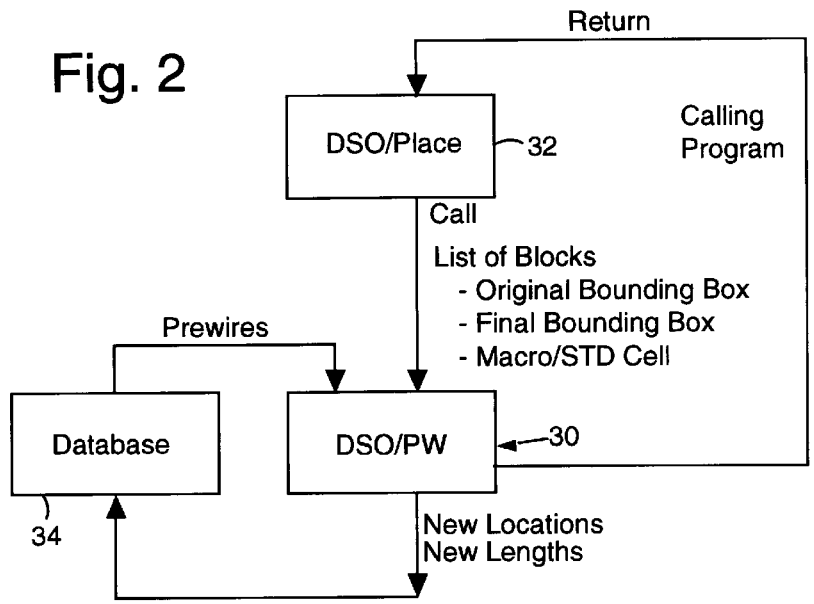
FIG. 2 is a flowchart of a design size optimizer and prewirer method embodiment of the present invention and a calling placement program and associated design database.

FIG. 2 diagrams a design size optimizer and prewirer process embodiment of the present invention, referred to herein by the general reference numeral 30. A calling program 32, e.g., a placement process, computes the resizing of standard cell areas and any movement of macrocell blocks based on a congestion analysis. Such information is passed in the call to the prewirer process 30, e.g., as a list of blocks. Each such block comprises an original bounding box and the final bounding box after resizing and a flag to indicate macrocell block or a standard cell block. Such resizing information and all the prewires are read from a database 34 to compute a set of new locations and lengths for the prewires. These objects are updated directly back to the database 34 before returning to the calling program 32.

In the reconstructing symbolic wires for each ring, strap and pin connect, the design size optimizer and prewirer process 30 must find a balance. While reconstructing ring wires 12 and 14, the original distance from the ring to the enclosed macrocell 20 or core boundary is retained. It may be acceptable to place a ring 12 or 14 at a minimum distance from a macrocell 20, but there may be several signal pins on one side of the macrocell which could get blocked as a result. It is expected that the user would have deliberately placed the ring 12 or 14 a certain number of tracks away, in the original floorplan 10, to allow such signal pins to be connected. When reconstructing straps 16, the same relative location to nearby macrocells 20 is preferably maintained. For example, if a strap 16 happens to lie exactly between two macrocells 20, then after reconstruction, it should reappear exactly between the same two macrocells. The relative topologies of the wires and blocks, and also the connection pattern amongst wires, is preferably maintained. Thus, no extra wire segments should be introduced. The effective changes are preferably made to the locations and lengths of the wire segments.

Figure 3:
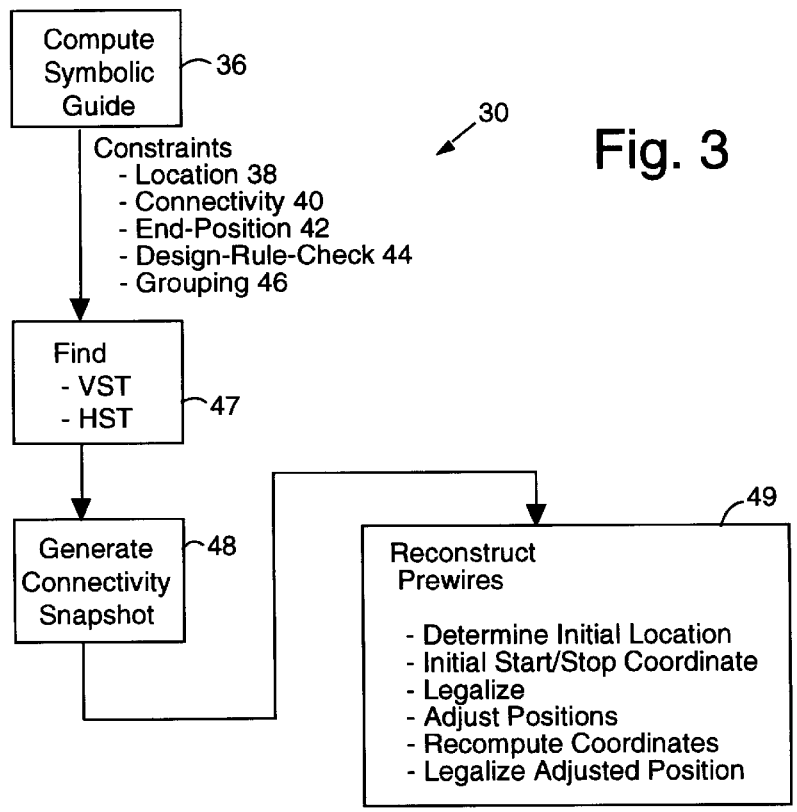
FIG. 3 is a flowchart of the design size optimizer and prewirer method of FIG. 2.

Referring to FIG. 3, the design size optimizer's prewirer process 30 initially computes, in a step 36, a symbolic guide for each prewire segment for each prewire already input. Each symbolic guide includes a set of location constraints 38, a set of connectivity constraints 40, a set of end-position constraints 42, a set of design-rule-check constraints 44 and a set of grouping constraints 46. A step 47 is used to find vertical and horizontal space tiles. A step 48 generates a connectivity snapshot. And a step 49 reconstructs the prewires.

The location constraints 38 define the distance each prewire has to nearby macrocells and/or standard cell blocks, and are useful in determining where a wire segment should be located subsequent to a block movement. The connectivity constraints 40 indicate the other prewires to which a particular one is connected to, either by abutment on same layer, or by a via to a wire on an adjacent layer. In practice, if a prewire has more than two connections, the connectivity information is kept only for the two most outlying connections.

The connectivity constraints 40 also preferably includes the exact location of the connection along a prewire segment. This value is zero, for example, for connections at the very end of the wire. The end-position constraints 42 include information as to how far from a closest block is the end of a prewire. If there exists no block, then the distance from the standard-cell core area is measured.

The design-rule-check constraints 44 indicate the minimum distance that a prewire segment must be from a boundary of a block to be design-rule-check correct. This also takes into account the presence of other prewires that may exist in between.

For the grouping constraints 46, if two or more prewires in the same horizontal or vertical direction are connected directly to each other, this fact is captured by a grouping constraint 46 to enable moving them as a group while retaining the connectivity. Otherwise, by optimizing the segments individually, it is possible that the two may end up in different locations, thereby causing an open circuit.

Location constraints 38 are critical to the positioning of prewires in the same symbolic sense after resizing. For each standard-cell block or macrocell block 20 in a floorplan 10, the boundaries are extended in the horizontal direction until either another block or chip boundary is encountered. Such will divide the empty area not occupied by blocks into a number of rectangles. Each such rectangle is referred to herein as a horizontal space tile (HST). Similarly, vertical space tiles (VST) can be constructed by projecting the vertical block edges.

By this construction, each HST will have precisely one block on its left edge and one block on its right edge. Similarly, a VST will have one adjacent bottom block and one top block. The chip boundary represents a special dummy block.

For a function Low_ST(s), where s is a pointer to a space tile, the left block is returned if s is a HST or the bottom block if s is a VST. Similarly, a function Hi_ST(s) returns the right or top block. The functions NLow_ST(s) and NHi_ST(s) are defined to represent the neighboring block (s) to the bottom (left) and top (right) of a HST (VST) s respectively.

For example, a horizontal prewire, w, can be used to find the horizontal space tile(s), S, that w lies in. The following pseudocode describes how the location constraints 38 can be generated.

```
For each s∈ S do
    For each b∈ NLow_ST(s) do
        If (dist(b,w) > MAXDIST ∈ ∈ NOT overlap(b,w))
            continue;
        Else
            Generate a location constraint for w :
                <b,disL(b,w) ,LOW>
        End
    For each b? NHi_ST(s) do
        If (disL(b,w) > MAXDIST ∈ ∈ NOT overlap(b,w))
            continue;
        Else
            Generate a location constraint for w :
                <b,dist(b,w) ,HI>
        End
    End
```

The function dist (b,w) returns the x-separation between b and w if w is a vertical wire, and returns the y-separation between b and w if w is a horizontal wire. Similarly, overlap(b,w) returns TRUE if the y-span intersects for a vertical wire w, and returns FALSE if the x-span intersects for a horizontal wire w.

A variable MAXDIST can be any number, but experience indicates that one quarter the chip dimension in that direction should be used. Its purpose is to discount the effect of blocks that are very far away, and so should not control the new location after resizing.

Design-rule-check constraints 44 establish the extent to which a wire can be moved with respect to a block, while being reasonably sure that the design-rule-check will be acceptable. For example, for two wires running parallel to each other to the right of a block, the farthest away wire from the block will surely be placed beyond the other one by at least the minimum spacing plus the width of the first wire, etc.

The following pseudocode describes how to generate design-rule-check constraints 44 for each vertical prewire. The horizontal prewire case is similar.

```
For each VST:s do:
    Let W = all vertical prewires that intersect s.
    Build constraint graph G:<V,E> as follows:
        Add a node v ∈ V for each prewire w?: W; add
    also a dummy node "low" to represent NLow_ST(s).
        Add an edge e ∈ E directed from node v1 to
    node v2 if prewire for v1 is to the left of prewire
    for v2; their vertical spans intersect; they are on
    same layer and there exists no other prewire
    between the two.
        Add an edge from "low" to all nodes that have
    no incoming edges.
        Assign a cost for each edge to be the min
    spacing between the corresponding two prewires plus
    the width of the first prewires related to that
    edge. Define this by cost(e) for each e ∈ E.
        Now generate the design-rule-check constraint
    for each prewire w∈ W as follows
        DRC(w) = DRC(w) + {<NLow_ST(s), p cost(low,w) ,
    LOW>},
        where p cost(low,w) = Σ cost(e) for all e that
    lie on the directed path from "low" to node v that
    defines w.
        The first term of the DRC constraint tuple is
    the index of the left neighbor of the VST(s)
        Repeat the same from NHi_ST(s) as well to
    generate yet another design-rule-check constraint
    for each w? W: <NHi_ST(s), cost(NHi_ST(s),w),HI>.
```

Similarly, all the horizontal prewires are done using horizontal space tiles.

Connectivity constraints 40 are used to generate and maintain a connectivity snapshot of the prewires. Each prewire segment is assigned an identification code to ensure the same connection pattern as before resizing.

The connectivity constraint 40 for a vertical (horizontal) prewire w is the set:

$$\{<w1,d1>,<w2,d2>\},$$

where w1 is the lowest (leftmost) orthogonal prewire of the same net that w is connected to either by abutment or by a via array. Likewise w2 is the topmost (rightmost) orthogonal prewire of the same net that w is connected to either by abutment or by a via array. Symbol d1 refers to the distance from the lower (left) endpoint of w to the centerline of w1. While d2 indicates the distance from the top (right) endpoint of w to the centerline of w2. It is possible that a wire may have only one connecting wire, e.g., w1=w2. Or if it is unconnected, then its connectivity constraint is empty and end-position constraints are used to determine the new "wire-length" of the wire.

End-position constraints 42 define the distance of each end point of a prewire from the nearest block before it in the direction of the prewire. If an endpoint is already inside a block, then the distance is measured from that block instead. A combination of end-position and connectivity constraints are preferably used to determine the initial wire-lengths.

Figure 4:
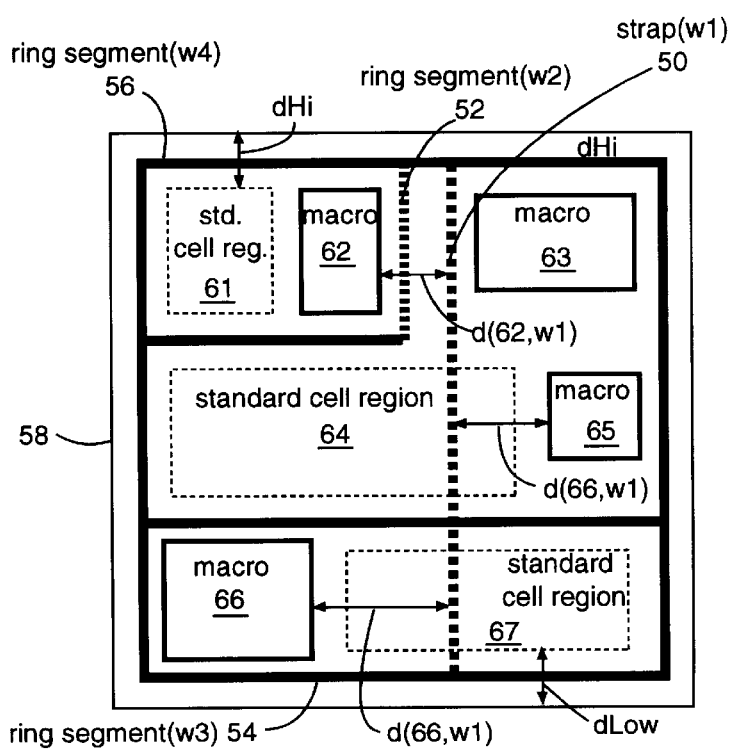
FIG. 4 is a plan view of a chip that supports the illustration of Table I related to the set of symbolic constraints for one prewire.

FIG. 4 represents the reconstruction of prewiring for a strap (w1) 50, a ring segment (w2) 52, a ring segment (w3) 54, and a ring segment (w4) 56 in a core area 58. Within the core area 58 are located a set of cell regions 61–67. Table I illustrates the extraction of a set of symbolic constraints that are extracted for the strap wire segment (w1) 50, assuming that: all wire segments are for the same net, all horizontal wires are on one routing layer, and all vertical wire segments are on the other. The numbers 62–66 respectively indicate the numbered blocks in FIG. 4, e.g., the distance between block 62 and the wire w1 is d(62, w1).

TABLE I

LOCATION CONSTRAINT FOR w1:
    <62,d(62,w1),LOW>
    <66,d(66,w1),LOW>
    <63,d(63,w1),HI>
    <65,d(65,w1),HI>
DRC CONSTRAINT FOR w1:
    <62,width(w1)+width(w2)+2*minSp,LOW>
    <63,minSp,HI>
    <65,minSp,HI>
    <66,minsp,LOW>
END-POSITION CONSTRAINT FOR w1:
    <core,dLow>
    <core,dHI>
CONNECTIVITY CONSTRAINT FOR w1:
    <w3,0>
    <w4,0>
GROUPING CONSTRAINT FOR w1:
    nil The minimum spacing rule is minSp for the vertical wiring layer. Since this is a strap, location constraints do not need to be extracted for the cell regions 64 and 67 overlapping this wire segment. This implies that the strap wire 50 has freedom to move out of the cell region 64 and 67, if required by another constraint. If w1 is marked as a ring wire, e.g., ring wire 52, the location constraints 38 extracted would try to replace the ring wire 52 so as to continue to overlap the cell regions 64 and 67. Shifting the straps 50 and rings 52, 54, and 56 that overlap cell regions 64 and 67 can cause overlaps with standard cells that may lie at the new location. The removal of these overlaps is preferably done by the calling placement process 32.

The reconstruction of the prewires is based upon extracting symbolic information about the prewires in a design prior to any floorplan updates. The overall approach for reconstruction is as follows:

For each w ∈ W: Determine initial new location
        of w based on the location and design-
        rule-check constraints 38 and 44.
    For each w ∈ W: Determine initial starting and
        stopping coordinate of w based on the
        connectivity and end-position constraints
        40 and 42 along with the present value of
        the wire location as determined in the
        first step.
    Legalize the location of each guide based on
        connectivity constraints and the position
        and length of connecting wires as
        determined in Steps 1, 2.
    Do
        If initial locations causes two wires to
            overlap adjust their positions
            incrementally.
        Recompute the start and stop coordinates of
            all prewires (as in Step 2).
        Legalize location (same as Step 3)
    While (no more changes OR max Iterations
        performed)

In determining initial locations, each prewire has a number of design-rule-check constraints 44 associated with it of the form <b,sep(b,w),HI>, or <b,sep(b,w),LOW >. Similarly, a number of location constraints 38 are associated of the form <b,dist(b,w),HI>or <b,dist(b,w),LOW >.

The design-rule-check constraints 44 are used to generate a legal region: <left,right>, as follows:

left=MAX (block_new_pos(b)+sep(b,w)) for each b in a design-rule-check Constraint of the form <b,sep(b,w), LOW.

right=MIN (block_new_pos(b)−sep(b,w)) for each b in a design-rule-check Constraint of the form <b,sep(b, w),HI).

At this step, if (left>(right-width(w)), there is an unresolvable conflict that necessitates a change in wiring topology. Such prewires can be dropped with a warning message. Another solution is to attempt to break the original prewire into two parts and then reconnect them with a jog.

Assuming a legal range for a prewire does exist, the location constraints 38 are similarly used to find a range of preferred locations for the prewire. The preferred region, <p_left, p_right>is computed with, $$p\_left=MAX\ (block\_new\_pos(b)+dist(b,w))$$

for each b in a location constraint of the form $$<b,dist(b,w),LOW;\ p\_right=MIN\ (block\_new\_pos(b)-dist(b,w))$$

for each b in a location constraint of the form <b,dist(b,w), HI).

Then the ideal positions are adjusted to conform to the legal region,

If (p_right>right), p_right=right, and
        if (p_left<left), p_left=left.

The wire-widths and spacing rules are being ignored here for the sake of this illustration only.

The final step is to use a wire classification to reduce the preferred range to a specific location. If the wire is marked as a strap, it is assumed that it is preferable to maintain the same relative location to blocks. The assigned initial location is (p_left+p_right)/2. If the wire was marked as a ring, then it is kept close to the macrocell or core that it encircles. The association between a segment and a macrocell is not always obvious, e.g., a ring segment lying in a small gap between two macrocells. Heuristics are used to resolve ambiguities, based on the proximity from a macrocell or how the other prewires that connect to a segment are routed. The distance may or may not be a good indicator. If the wire segment is connected to two other prewires that enclose a macrocell to the left, then that fact indicates that this segment should move with the macrocell to its left. So, for a ring wire that should be associated with a block to its left, p_left is used as the initial assigned location. For a ring wire that should be associated with a block to its right, p_right is used as the initial assigned location.

In general, a move-type for each prewire is <left,right, ratio>. The first two, left and right, are usually assigned to ring wire segments that should be relocated with a macrocell to the left (right) of the prewire. The term, ratio, is used for strap wire segments. This assignment can be opened up to a user interface to allow the selection of wire segments and to manually assign one of the possible move types for that segment, since with any heuristic, a worst case can be described where any given heuristic may not perform in the exact manner that the user desires.

Groups are generated for the connected prewires that share the same orientation and wiring layer. Grouping constraints influence the legal locations and the ideal positions of the prewires within the group. For the legal locations, the <left, right>values are computed for each prewire within the group. Then the MAX of all left values and the MIN of all the right values are used as the new <left,right>for each prewire. If a prewire is part of a group, a dominating member of the group is computed heuristically. This is usually the biggest, in terms of routing area, prewire within the group. The preferred position of that prewire is computed and then the shift of that prewire is used to compute the new locations of all the other prewires in the group. This is easy to do, because the initial relative location of each prewire within the group is known.

Preferably, the design size optimizer and prewirer process 30 is not required to recreate the pin connections, since these can usually be generated automatically. But manual intervention is usually needed for rings and straps. Pin connects are not as critical in the estimating of the routing congestion, since the pins are relatively short. Alternatively, the design size optimizer and prewirer process 30 can also be extended a little to make such pin connects. For example, pin connections can generate location constraints that effectively constrain the wire to a certain fixed location relative to the macrocell origin, e.g., the pin location. Similarly for prewires that cross macrocell blocks, location constraints can be generated that effectively limit the legal location range to the span of the macrocell block.

Another common situation includes bus routing styles. Preferably, all the segments of a bus are kept together. However, in an initial assignment, each prewire piece could be moved away from one another since the locations are individually determined. A major influence is the move-type associated with each wire. So, a move-type assigner function is implemented that looks at neighboring prewires that are part of a bus. All the segments are moved together, e.g., either left or right, as a group. In one embodiment, the number of prewires are counted that are initially assigned to be moved along with a block to the left. The number to be moved are counted along with the block to the right. The majority is assigned to the group of prewires as a whole, and has provided good results without a significant run-time penalty.

The initial wire-lengths are determined using the connectivity and end-position constraints 42. For example, if a vertical wire is connected at both its ends to other horizontal prewires, the location determined in the previous step is used as the starting and stopping points of the segment, subject to the end-position constraints 42. The stopping points specify the distance from a block boundary for the original segment. If the connectivity constraint does not exist, or if the connection is to a wire that is too far from a certain end of a prewire, then the end-position constraint is used.

The wire locations should be legalized because the initial position determined for wires can cause overlaps between adjacent real wires. This is especially true for the ones for which the assigned position is the mean of p_left and p_right. For some wire pieces that are not next to a block boundary, it is possible that the only location constraints are at the chip boundary. For example, if the pin connects are retained. Such constraints may not match with the movement of the end segments, and may cause the segment to fall off the span of connecting segments. So to maintain the topology, the initial location should be adjusted to be within the span of the connecting segments.

In either case, the violation is eliminated by finding the closest legal location, rather than trying to optimize the resulting location of the segment. Nevertheless, the elimination process causes the least disturbance to the majority of wires at their preferred positions.

This process is repeated for a few more iterations until no more changes are needed, since altering the location of a wire can change the starting and or stopping coordinates of other prewires that connect to it. Usually only one additional pass is required.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A method for designing an integrated circuit chip, the method comprising the steps of:

calling a design size optimization and prewirer process during an automatic placement and floor-planning of an integrated circuit chip with a list of blocks comprising information related to an original bounding box, a final bounding box and an indication of macrocell versus standard cell;

inputting a list of prewire information from a design database;

outputting a set of new locations and new lengths for said prewire information back to said design database; and returning to a placement process;

wherein, a chip floorplan is automatically constructed with power-ground-clock preroutes for a placement and routing process.

2. The method of claim 1, wherein:

the inputting includes prewire information related to macro rings, core rings, straps and pin connects placed in relation to a plurality of macrocells in a core area of a particular integrated circuit chip design floorplan.

3. The method of claim 1, further including after the step of inputting, the step of:

initially computing a symbolic guide for each prewire segment information that includes a set of location constraints, a set of connectivity constraints, a set of end-position constraints, a set of design-rule-check constraints and a set of grouping constraints.

4. The method of claim 3, wherein:

the step of initially computing said symbolic guide is such that said location constraints define the distance each prewire has to nearby macrocells and/or standard cell blocks, and are used in determining where a wire segment should be located subsequent to a block movement.

5. The method of claim 3, wherein:

the step of initially computing said symbolic guide is such that said connectivity constraints indicate the other prewires to which a particular one is connected to, either by abutment on same layer, or by a via to a wire on an adjacent layer.

6. The method of claim 3, wherein:

the step of initially computing said symbolic guide is such that said end-position constraints include information as to how far from a closest block is the end of a prewire, and if there exists no block, then the distance from a standard-cell core area is measured.

7. The method of claim 3, wherein:

the step of initially computing said symbolic guide is such that said design-rule-check constraints indicate a minimum distance that a prewire segment must be from a boundary of a block to be design-rule-check correct, and takes into account the presence of other prewires that may exist in between.

8. The method of claim 3, wherein:

the step of initially computing said symbolic guide is such that said grouping constraints mark if two or more prewires in the same horizontal or vertical direction are connected directly to each other, to enable moving them as a group while retaining the connectivity.

9. The method of claim 3, wherein:

the step of initially computing said symbolic guide is an efficient process wherein each standard-cell block or macrocell block in a floorplan has its boundaries extended in the horizontal direction until either another block or chip boundary is encountered to divide any empty area not occupied by blocks into a plurality of horizontal space tiles (HST) and vertical space tiles (VST) constructed by projecting the vertical and horizontal block edges.

10. A method for reconstructing prewires in the automatic placement and floor-planning of an integrated circuit chip, the method comprising the steps of:

calling a design size optimization and prewirer process with a list of blocks comprising information related to an original bounding box, a final bounding box and an indication of macrocell versus standard cell;

inputting a list of prewire information from a design database including prewire information related to macro rings, core rings, straps and pin connects placed in relation to a plurality of macrocells in a core area of a particular integrated circuit chip design floorplan;

initially computing a symbolic guide for each prewire segment information that includes a set of location constraints, a set of connectivity constraints, a set of end-position constraints, a set of design-rule-check constraints and a set of grouping constraints, and such that said location constraints define the distance each prewire has to nearby macrocells and/or standard cell blocks, and are used in determining where a wire segment should be located subsequent to a block movement, such that said connectivity constraints indicate the other prewires to which a particular one is connected to, either by abutment on a same layer, or by a via to a wire on an adjacent layer, and such that said end-position constraints include information as to how far from a closest block is the end of a prewire, and if there exists no block, then the distance from a standard-cell core area is measured, and such that said design-rule-check constraints indicate a minimum distance that a prewire segment must be from a boundary of a block to be design-rule-check correct, and takes into account the presence of other prewires that may exist in between, and such that said grouping constraints mark if two or more prewires in the same horizontal or vertical direction are connected directly to each other, to enable moving them as a group while retaining the connectivity;

outputting a set of new locations and new lengths for said prewire information back to said design database; and returning to a placement process;

wherein, said symbolic guide and each standard-cell block or macrocell block in a floorplan has its boundaries extended in the horizontal direction until either another block or chip boundary is encountered to divide any empty area not occupied by blocks into a plurality of horizontal space tiles (HST) and vertical space tiles (VST) constructed by projecting the vertical and horizontal block edges.

11. A system for reconstructing prewires in the automatic placement and routing of an integrated circuit chip, comprising:

a computer for calling a design size optimization and prewirer process with a list of blocks comprising information related to an original bounding box, a final bounding box and an indication of macrocell versus standard cell;

a peripheral for inputting a list of prewire information from a design database that includes prewire information related to macro rings, core rings, straps and pin connects placed in relation to a plurality of macrocells in a core area of a particular integrated circuit chip design floorplan;

a calculator for initially determining a symbolic guide for each prewire segment information that includes a set of location constraints, a set of connectivity constraints, a set of end-position constraints, a set of design-rule-check constraints, and a set of grouping constraints, wherein said location constraints define the distance from each prewire to nearby macrocells and/or standard cell blocks, and determine where a wire segment should be located subsequent to a block movement, wherein, said connectivity constraints indicate the other prewires to which a particular one is connected to, either by abutment on a same layer, or by a via to a wire on an adjacent layer, and such that said end-position constraints include information as to how far from a closest block is the end of a prewire, and if there exists no block, then the distance from a standard-cell core area is measured, and wherein, said design-rule-check constraints indicate a minimum distance that a prewire segment must be from a boundary of a block to be design-rule-check correct, and takes into account the presence of other prewires that may exist in between, and wherein, said grouping constraints mark if two or more prewires in the same horizontal or vertical direction are connected directly to each other, to enable moving them as a group while retaining the connectivity;

means for outputting a set of new locations and new lengths for said prewire information back to said design database; and means for returning program control to a placement process;

wherein, said symbolic guide and each standard-cell block or macrocell block in a floorplan has its boundaries extended in the horizontal direction until either another block or chip boundary is encountered to divide any empty area not occupied by blocks into a plurality of horizontal space tiles (HST) and vertical space tiles (VST) constructed by projecting the vertical and horizontal block edges.

* * * * *